(12) United States Patent
Chiu

(10) Patent No.: US 10,734,308 B2
(45) Date of Patent: Aug. 4, 2020

(54) SEMICONDUCTOR DEVICE AND METHOD FOR MANUFACTURING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/212,072

(22) Filed: Dec. 6, 2018

(65) Prior Publication Data

US 2020/0161220 A1    May 21, 2020

Related U.S. Application Data

(60) Provisional application No. 62/769,923, filed on Nov. 20, 2018.

(51) Int. Cl.
| | | |
|---|---|---|
| H01L 23/48 | (2006.01) | |
| H01L 21/768 | (2006.01) | |
| H01L 23/532 | (2006.01) | |
| H01L 21/304 | (2006.01) | |
| H01L 25/065 | (2006.01) | |

(52) U.S. Cl.
CPC ......... H01L 23/481 (2013.01); H01L 21/304 (2013.01); H01L 21/7684 (2013.01); H01L 21/76852 (2013.01); H01L 21/76889 (2013.01); H01L 21/76898 (2013.01); H01L 23/53257 (2013.01); H01L 25/0657 (2013.01); H01L 2225/06513 (2013.01); H01L 2225/06544 (2013.01)

(58) Field of Classification Search
CPC .................. H01L 21/76898; H01L 23/481
See application file for complete search history.

(56) References Cited

U.S. PATENT DOCUMENTS

2010/0314758 A1* 12/2010 Wu ................... H01L 21/76898
257/737
2018/0019187 A1    1/2018 Lagouge et al.

FOREIGN PATENT DOCUMENTS

| CN | 101924096 A | 12/2010 |
|---|---|---|
| TW | 201017850 A | 5/2010 |
| TW | 201739959 A | 11/2017 |
| TW | 201806005 A | 2/2018 |

OTHER PUBLICATIONS

Office Action dated Feb. 18, 2020 related to Taiwanese Application No. 107147724.

* cited by examiner

*Primary Examiner* — Daniel P Shook
(74) *Attorney, Agent, or Firm* — Muncy, Geissler, Olds & Lowe, P.C.

(57) ABSTRACT

The present disclosure relates to a semiconductor device and a method of manufacturing the same. The semiconductor device includes a semiconductor substrate and at least one through silicon via. The through silicon via includes a conductive plug, a first insulation layer, and a diffusion barrier layer. The conductive plug penetrates through the semiconductor substrate. The first insulation layer surrounds the conductive plug. The diffusion barrier layer is disposed between the conductive plug and the first insulation layer, and is utilized to prevent out-diffusion of dopant impurities from the conductive plug to the semiconductor substrate.

9 Claims, 12 Drawing Sheets

SEMICONDUCTOR DEVICE AND METHOD FOR MANUFACTURING THE SAME

PRIORITY CLAIM AND CROSS-REFERENCE

This application claims the priority benefit of U.S. provisional application Ser. No. 62/769,923, filed on Nov. 20, 2018. The entirety of the above-mentioned patent application is hereby incorporated by reference herein and made a part of this specification.

TECHNICAL FIELD

The present disclosure relates to a semiconductor device and a method of manufacturing the same, and more particularly, to a semiconductor device having at least one through silicon via and a method of manufacturing the same.

DISCUSSION OF THE BACKGROUND

As semiconductor devices, such as memory devices, are becoming increasingly integrated, achieved degree of integration with typical two-dimensional (2D) structures is rapidly approaching its limit. Therefore, there is a need for a semiconductor memory device having a three-dimensional (3D) structure that exceeds the integration capability of the 2D structure. Such need has led to extensive research into developing 3D semiconductor memory device technology.

In a 3D semiconductor memory device, various signals carrying data, commands, or addresses are transmitted, some or all of which are transmitted through a through silicon via (TSV). For the current process and techniques, the through silicon via technique is divided into three types, including the via-first process, the via-middle process, and the via-last process. In the via-first process, through silicon holes are formed on the silicon substrate (or wafer) and filled with a conductive material before the formation of the main device, such as a metal-oxide-semiconductor (MOS) device. Considering the high temperature of procedures in the subsequent MOS process, the selection of the conductive material is basically limited to those which can withstand high temperatures, such as polysilicon, rather than the otherwise-desirable copper, because copper tends to exhibit pumping and is unable to maintain a low electrical resistance after being subject to repeated thermal processes.

However, when the thermal process is carried out, dopants is introduced into the polysilicon for reducing the resistance thereof diffuse from the polysilicon into the main device, where out-diffusion of the dopants may alter the electrical characteristics of the main device.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a semiconductor substrate and at least one through silicon via. The through silicon via includes a conductive plug, a first insulation layer, and a diffusion barrier layer. The conductive plug penetrates through the semiconductor substrate, the first insulation layer surrounds the conductive plug, and the diffusion barrier layer is disposed between the conductive plug and the first insulation layer.

In some embodiments, the semiconductor device further includes a metal layer disposed between the first insulation layer and the diffusion barrier layer.

In some embodiments, the metal layer includes a metal material, and the diffusion barrier layer includes the metal material.

In some embodiments, the diffusion barrier layer is a metal silicide layer.

In some embodiments, the semiconductor device further includes a second insulation layer disposed on a front surface of the substrate.

In some embodiments, a top surface of the conductive plug is coplanar with an upper surface of the second insulation layer.

In some embodiments, the first insulation layer is connected to the second insulation layer.

In some embodiments, the first insulation layer and the second insulation layer are integrally formed.

In some embodiments, the first insulation layer is in contact with the semiconductor substrate.

In some embodiments, the semiconductor device further includes at least one semiconductor component disposed on the semiconductor substrate.

Another aspect of the present disclosure provides a method of manufacturing a semiconductor device. The method includes steps of providing a semiconductor substrate; forming at least one blind hole in the semiconductor substrate; depositing a metal layer on a front surface of the semiconductor substrate and extending into the blind hole; depositing a silicon-containing conductive material in the blind hole; performing a thermal process to make portions of the metal layer react with the silicon-containing conductive material to form a diffusion barrier layer; and performing a grinding process from a back surface, opposite to the front surface, of the semiconductor substrate until the is conductive material is exposed.

In some embodiments, the method further includes a step of depositing an insulation layer on the front surface of the semiconductor substrate and extending into the blind hole before the deposition of the metal layer.

In some embodiments, the insulation layer is a substantially conformal layer.

In some embodiments, the silicon-containing conductive material is deposited into the blind hole until a top surface of the silicon-containing conductive material is higher than an upper surface of the metal layer.

In some embodiments, the method further includes a step of performing a planarizing process to planarize the silicon-containing conductive material and the metal layer until the insulation layer is exposed.

In some embodiments, the metal layer has a uniform thickness.

In some embodiments, the thermal process is performed at a temperature in a range between 700 and 800° C.

In some embodiments, the method further includes a step of forming at least one semiconductor component on the semiconductor substrate.

With the above-mentioned configurations of the semiconductor device, out-diffusion of dopant from the conductive plug during a thermal process is prevented. In addition, a total resistance of the through silicon via is reduced.

The foregoing has outlined rather broadly the features and technical advantages of the present disclosure in order that the detailed is description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
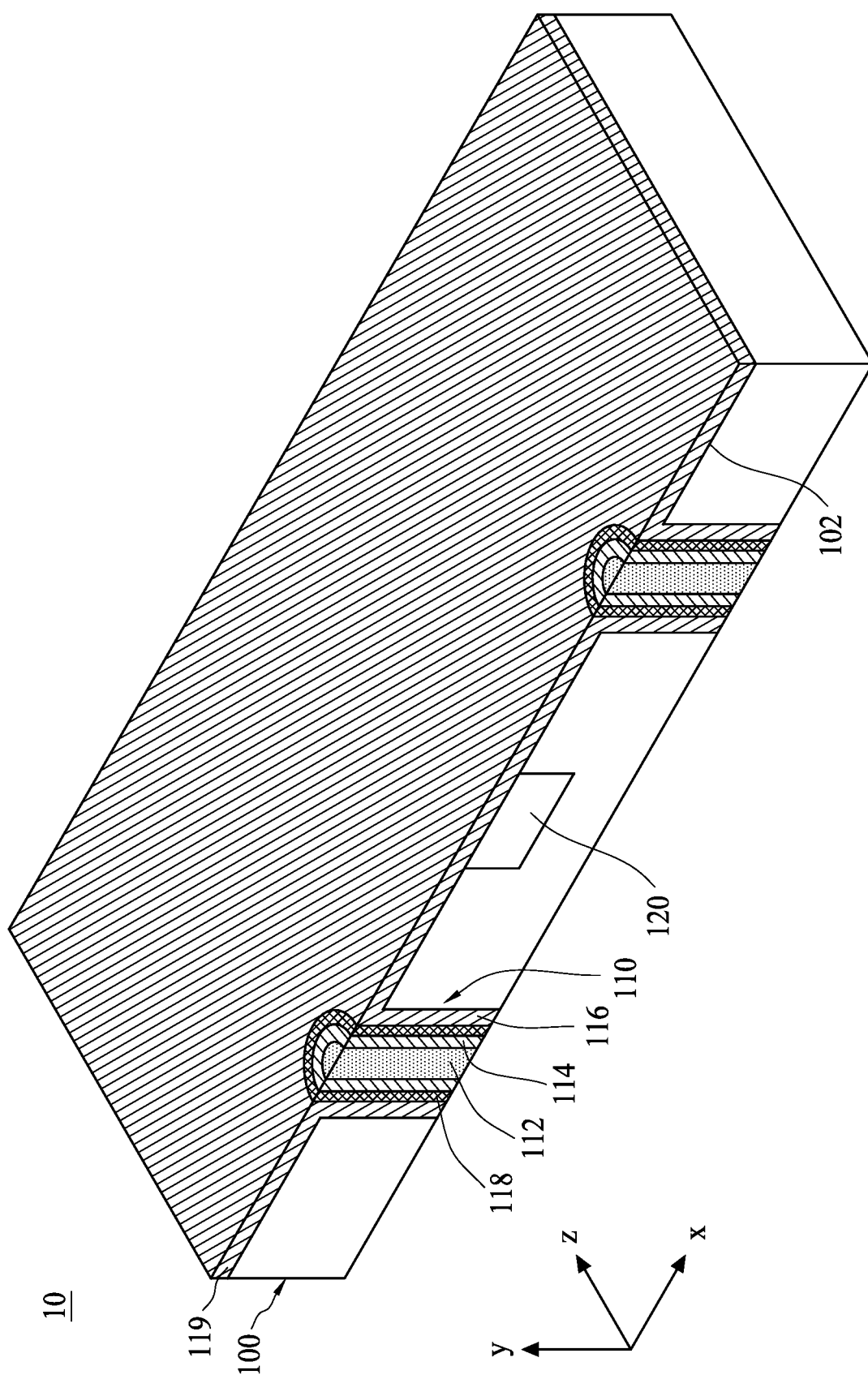
FIG. 1 is a perspective view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood is that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a perspective view of a semiconductor device 10 in accordance with some embodiments of the present disclosure. Referring to FIG. 1, the semiconductor device 10 includes a semiconductor substrate 100, at least one through silicon via 110, and at least one semiconductor component 120. In some embodiments, the through silicon via 110 is located in the semiconductor substrate 100. In some embodiments, the semiconductor component 120, such as a MOS transistor, is formed on a front surface 102 of the semiconductor substrate 100. In some embodiments, the through silicon via 110 is formed before creating the semiconductor component 120.

In some embodiments, the through silicon via 110 includes a conductive plug 112, a diffusion barrier layer 114, and a first insulation layer 116. In some embodiments, the conductive plug 112 is disposed in the semiconductor substrate 100. In some embodiments, the first insulation layer 116 is connected to the semiconductor substrate 100 and surrounds the conductive plug 112. In some embodiments, the diffusion barrier layer 114 is disposed between the conductive plug 112 and the first insulation layer 116. In some embodiments, the conductive plug 112 includes doped polysilicon. In some embodiments, the conductive plug 112 may be doped using a dopant such as boron, phosphorous, or arsenic. In some embodiments, the diffusion barrier layer 114 is a metal silicide layer. In some embodiments, the diffusion barrier layer 114 includes titanium disilicide ($TiSi_2$). In some is embodiments, the first insulation layer 116 includes silicon oxide. In some embodiments, the through silicon via 110 further includes a metal layer 118 disposed between the diffusion barrier layer 114 and the first insulation layer 116. In some embodiments, the metal layer 118 includes titanium. In some embodiments, the semiconductor device 10 further includes a second insulation layer 119 disposed on the front surface 102. In some embodiments, the second insulation layer 119 is connected to the first insulation layer 116. In some embodiments, a material of the first insulation layer 116 and a material of the second insulation layer 119 are consistent. In some embodiments, the first insulation layer 116 and the second insulation layer 119 are integrally formed.

Figure 2:
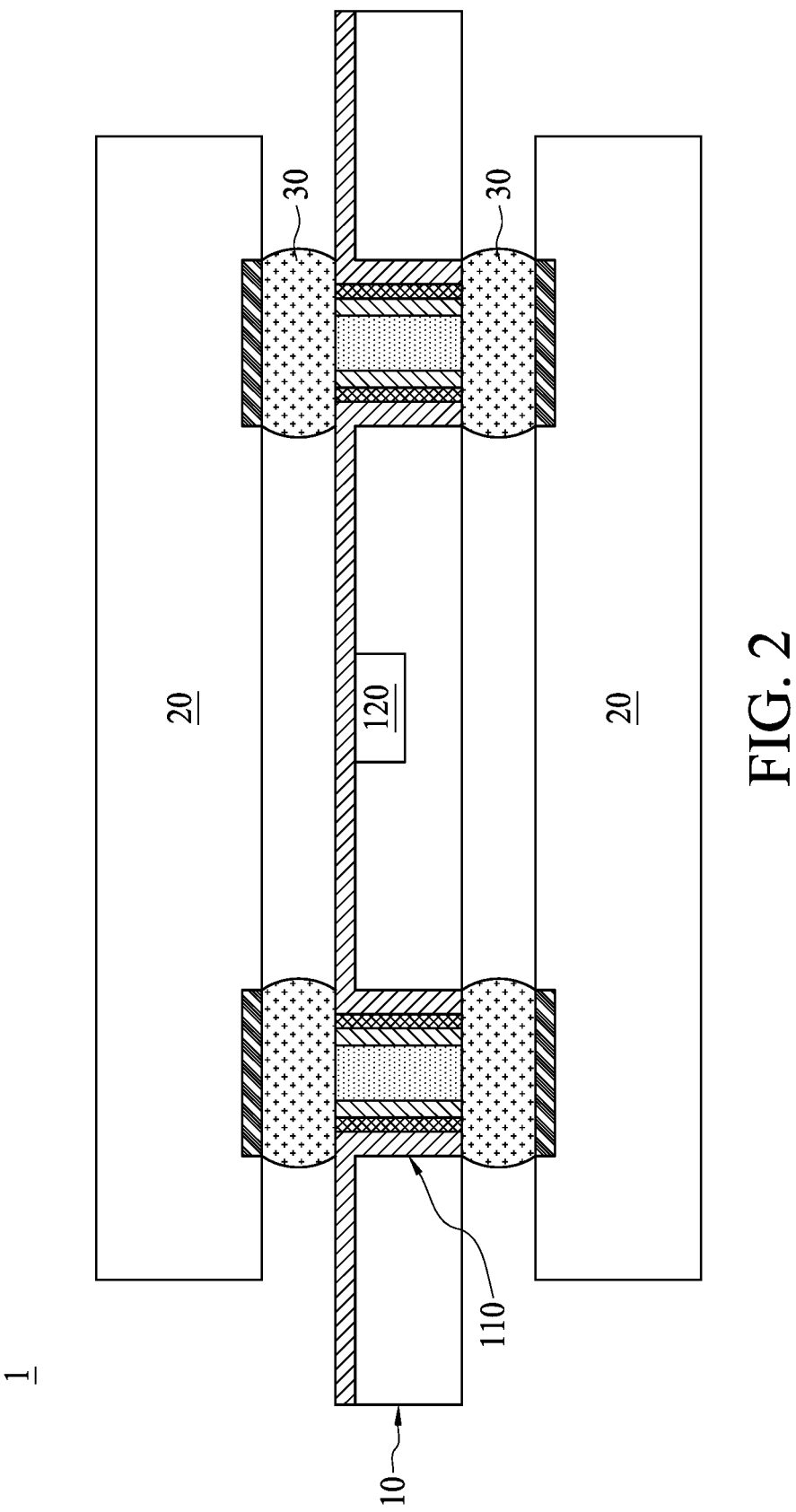
FIG. 2 is a cross-sectional view of stacked semiconductor devices in accordance with some embodiments of the present disclosure.

In some embodiments, the semiconductor device 10 may be electrically coupled to at least one semiconductor device 20 by the through silicon vias 110, as shown in FIG. 2. In some embodiments, the through silicon via 110 is formed in the semiconductor device 10 to be stacked. In some embodiments, the semiconductor devices 20 are mounted to the through silicon vias 110, using bumps 30. In some embodiments, the semiconductor device 20 may contain analog or digital circuits implemented as active devices and passive devices electrically interconnected according to an electrical design and function of the semiconductor devices 20.

Figure 3:
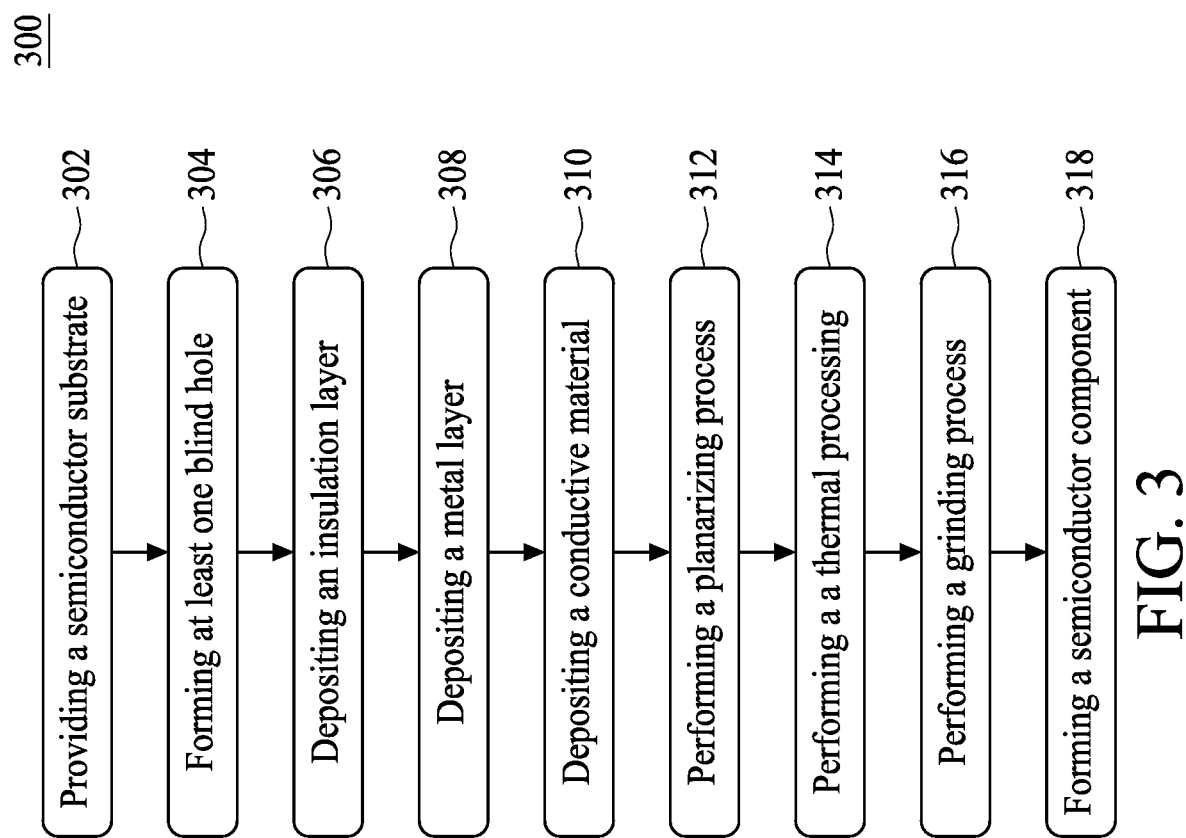
FIG. 3 is a flow diagram illustrating a method of manufacturing a semiconductor device in accordance with some embodiments of the present disclosure.

FIG. 3 is a flow diagram illustrating a method 300 for manufacturing a semiconductor device 10 in accordance with some embodiments of the present disclosure. FIGS. 4 to 12 are schematic diagrams illustrating various fabrication stages constructed according to the method 300 for manufacturing the semiconductor device 10 in accordance with some embodiments of the present disclosure. The is stages shown in FIGS. 4 to 12 are also illustrated schematically in the flow diagram in FIG. 3. In the subsequent discussion, the fabrication stages shown in FIGS. 4 to 12 are discussed in reference to the process steps in FIG. 3.

Figure 4:
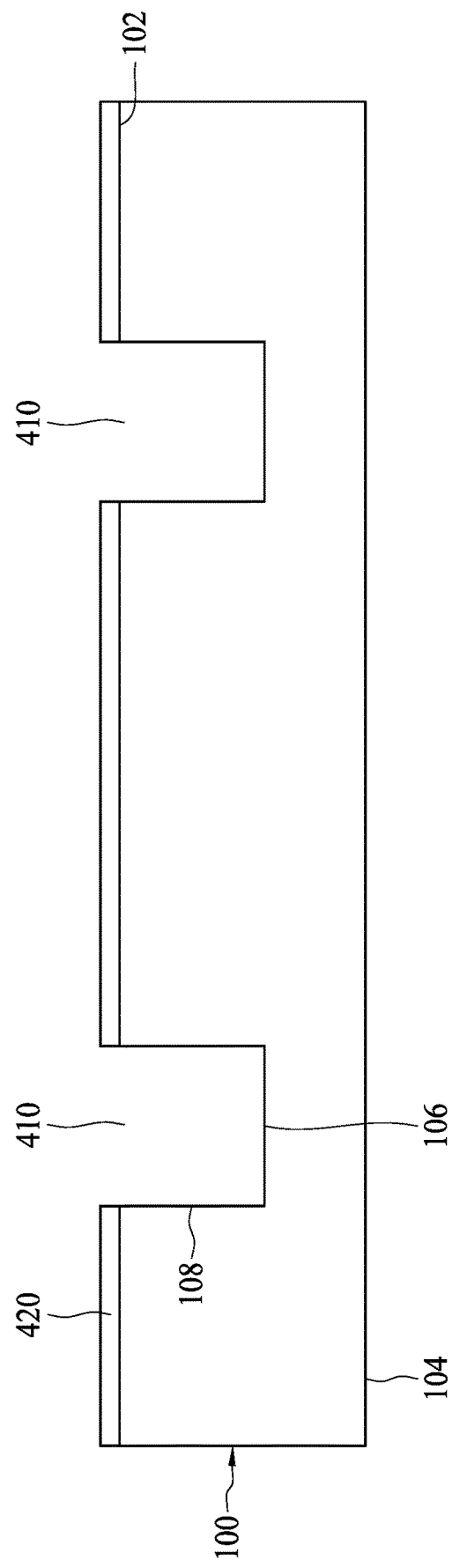
FIGS. 4 through 12 are cross-sectional views of intermediate is stages in the manufacturing a semiconductor device in accordance with some embodiments of the present disclosure.

Referring to FIG. 4, in some embodiments, a semiconductor substrate 100 is provided according to a step 302 in FIG. 3. In some embodiments, examples of the material suitable for the semiconductor substrate 100 include, but are not limited to, silicon, silicon on insulator, silicon on sapphire, and gallium arsenide. In some embodiments, the semiconductor substrate 100 includes a front surface 102 and a back surface 104 opposite to the front surface 102.

Next, a photoresist 420 is formed over the semiconductor substrate 100, and is then patterned. A patterning process is then performed to etch the semiconductor substrate 100 to form least one blind hole 410 according to a step 304 in FIG. 3. In some embodiments, the semiconductor substrate 100 is etched by, for example, a reactive ion etching (RIE) process. In some embodiments, the remaining semiconductor substrate 100 has a first wall 106 substantially parallel to the front surface 102 and a second wall 108 adjacent to the front surface 102 and the first wall 106.

Figure 5:
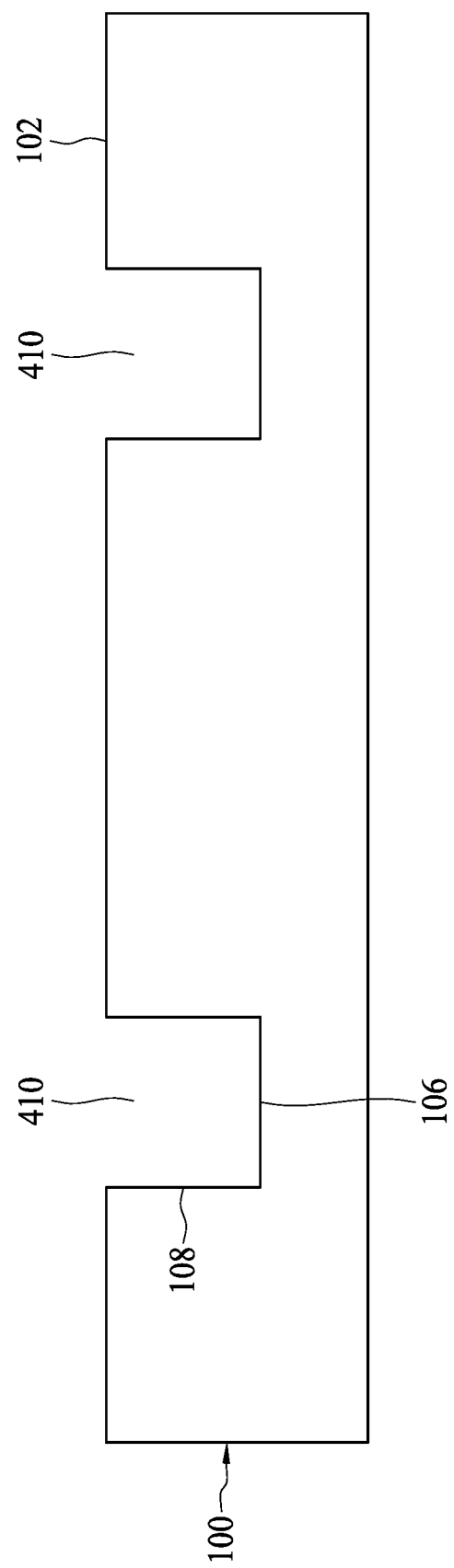
Figure 6:
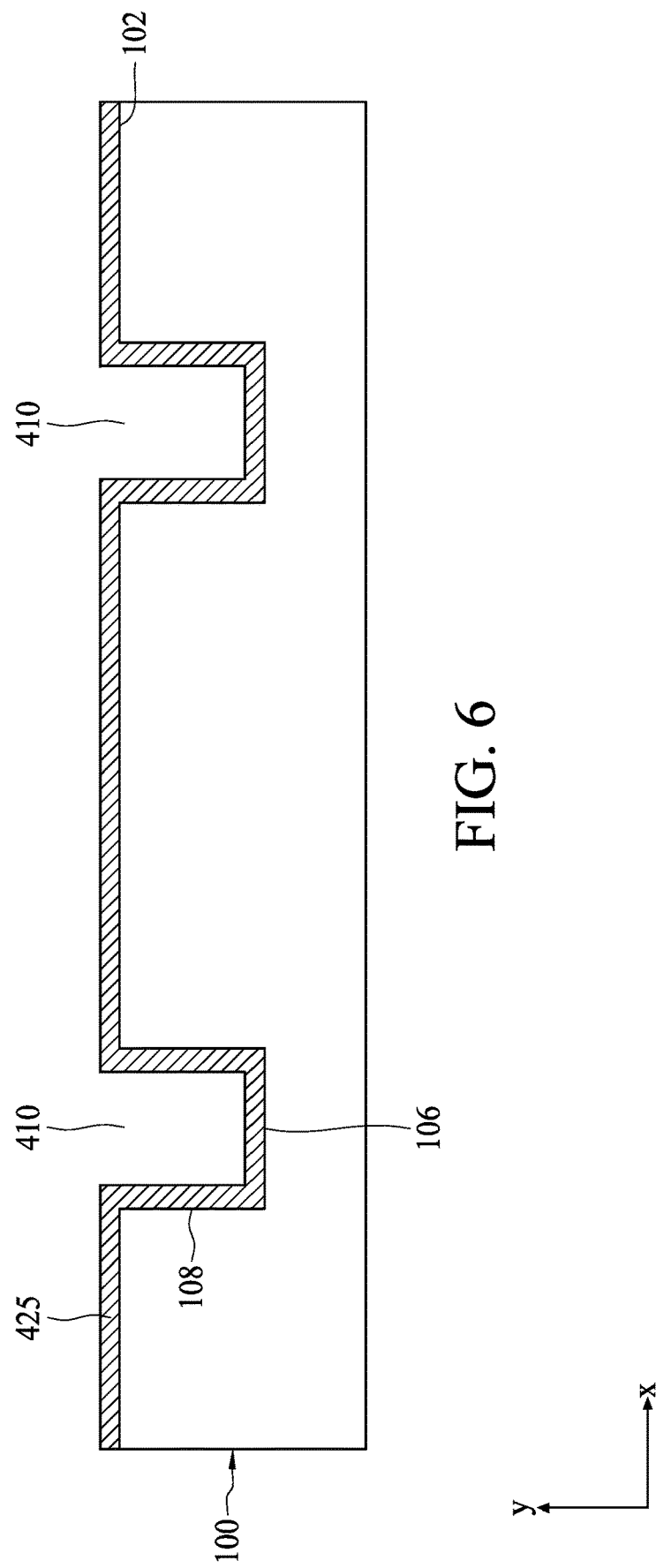

Referring to FIG. 5, in some embodiments, the photoresist layer 420 is then removed, for example, through an ashing process. Next, as shown in FIG. 6, an insulation layer 425 is formed on the front surface 102, and extends into the blind hole 410 according to a step 306 in FIG. 3. In some embodiments, the insulation layer 425 is a substantially conformal layer, wherein the horizontal portions (along the x direction) and the vertical portions (along the y direction) of the is insulation layer 425 have substantially a same thickness. In some embodiments, the insulation layer 425 is disposed on the front surface 102, the first wall 106, and the second wall 108. In some embodiments, the insulation layer 425 includes silicon dioxide, silicon nitride, silicon carbide, silicon oxynitride, combinations thereof, or a multi-layer thereof. In some embodiments, the insulation layer 425 is formed using a chemical vapor deposition (CVD) process or a thermal oxidation process. In some embodiments, the insulation layer 425 is used to prevent conductive material (as will be described later) from shorting to the semiconductor substrate 100.

Figure 7:
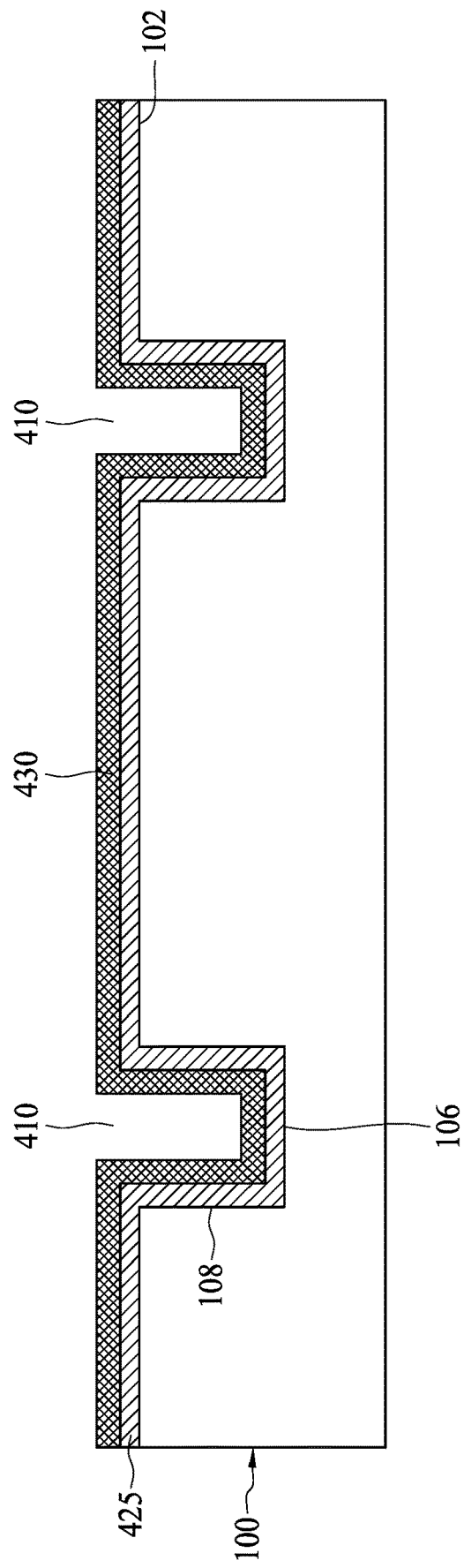

Referring to FIG. 7, in some embodiments, a metal layer 430 is deposited on the insulation layer 425 according to a step 308 in FIG. 3. In some embodiments, the metal layer 430, which also acts as a glue layer, is blanket formed to cover the insulation layer 425. In some embodiments, the metal layer 430 has a uniform thickness. In some embodiments, the metal layer 430 includes a metal material, such as titanium. In some embodiments, the metal layer 430 includes titanium or titanium alloys. In some embodiments, the metal layer 430 is formed using physical vapor deposition (PVD), for example.

Figure 8:
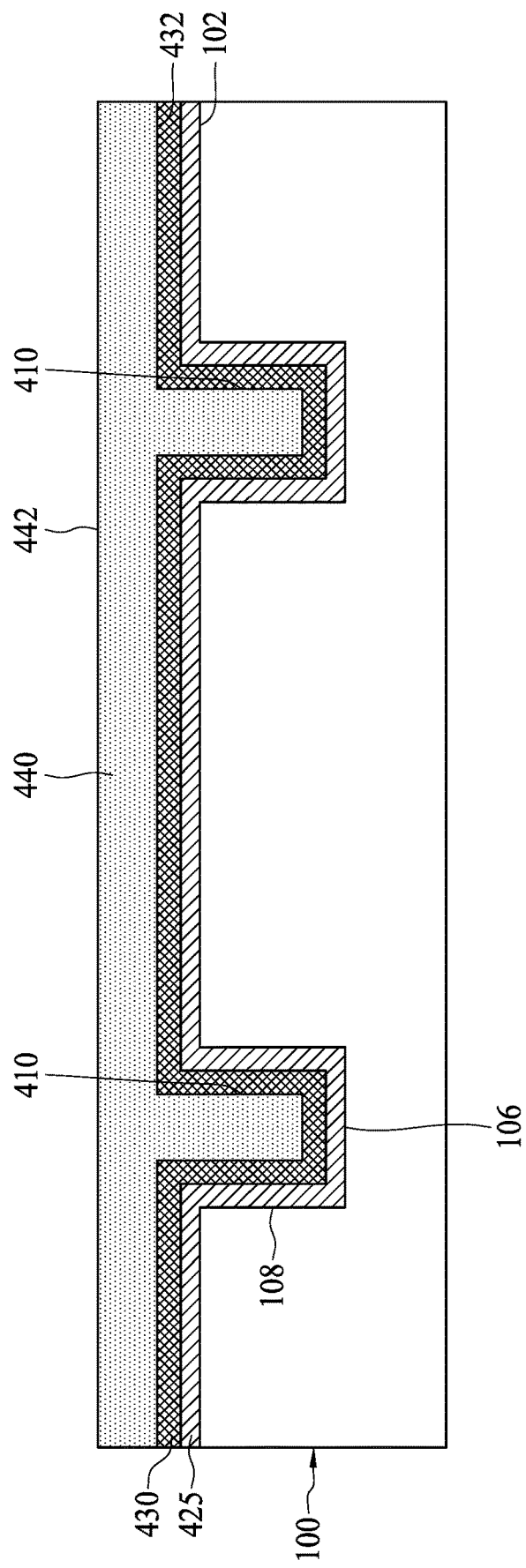

Referring to FIG. 8, in some embodiments, a silicon-containing conductive material 440 is deposited into the blind hole 410 according to a step 310 in FIG. 3. In some embodiments, the silicon-containing conductive material 440 is deposited in the blind hole 410 until a top surface 442 of the silicon-containing conductive material 440 is higher than an upper surface 432 of the metal layer 430. In some embodiments, the silicon-containing conductive material 440 may cover the upper surface 432 of the metal layer 430. In some embodiments, the silicon-containing conductive material 440 includes is doped polysilicon. In some embodiments, the silicon-containing conductive material 440 is deposited using, for example, a low-pressure CVD process.

Figure 9:
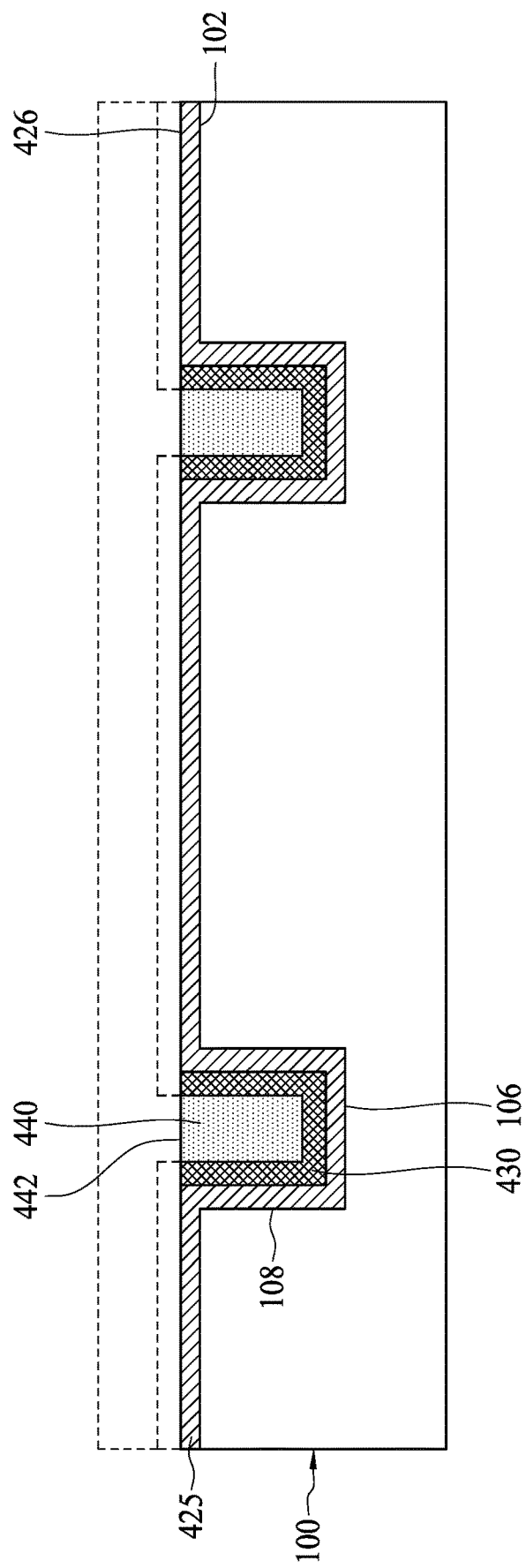

Referring to FIG. 9, in some embodiments, a planarizing process is performed for removing the excess silicon-containing conductive material 440 and the excess of the metal layer 430 according to a step 312 in FIG. 3. In some embodiments, the silicon-containing conductive layer 440 and the metal layer 430 are planarized until the insulation layer 425 is exposed. In some embodiments, a chemical mechanical polishing (CMP) process is used to provide a planar topography such that a top surface 442 of the silicon-containing conductive material 440 is approximately coplanar with an upper surface 426 of the insulation layer 425. In some embodiments, the silicon-containing conductive layer 440 undergoes the CMP process utilizing the insulation layer 425 as a polish stop.

Figure 10:
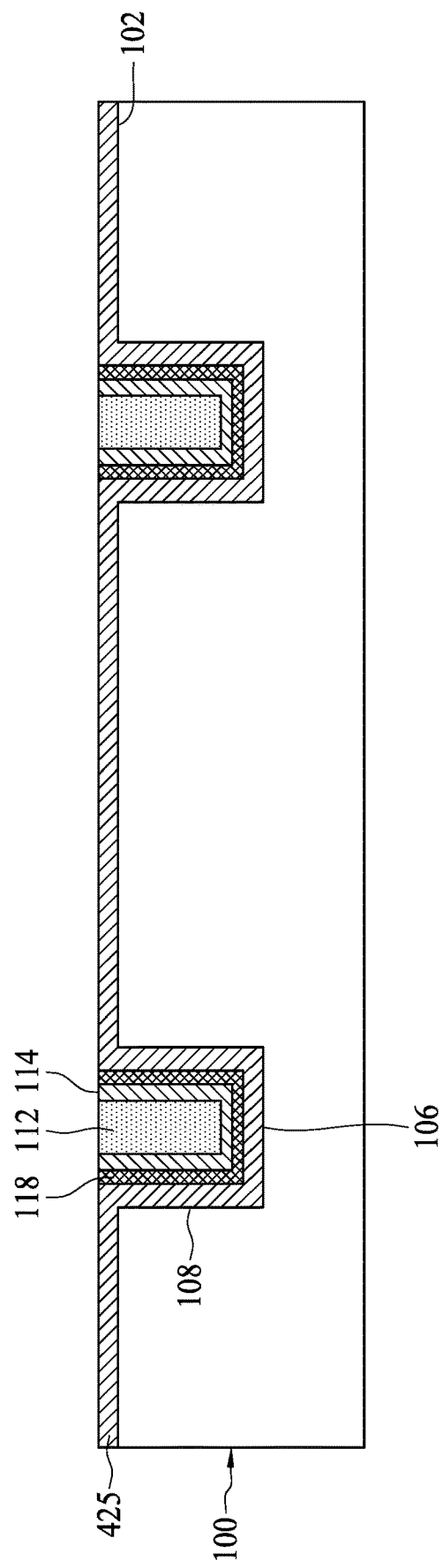

Referring to FIG. 10, a thermal process is performed to at least make portions of the metal layer 430 react with the silicon-containing conductive material 440 to form a diffusion barrier layer 114 according to a step 314 in FIG. 3. In some embodiments, the metal layer 430 reacts with silicon in the silicon-containing conductive material 440 and forms the diffusion barrier layer 114. Accordingly, the diffusion barrier layer 114 is a metal silicide layer. In some embodiments, the diffusion barrier layer 114 includes titanium disilicide. In some embodiments, the unreacted silicon-containing conductive material 440 forms a conductive plug 112. In some embodiments, there remains a portion of unreacted metal layer as the residue of metal layer 118, disposed between the insulation layer 425 and the diffusion barrier layer 114. In some embodiments, the thermal process utilized to form is the diffusion barrier layer 114 is preferably a rapid thermal annealing (RTA) process. In some embodiments, the thermal process is performed at a temperature in a range between 700 and 800° C. In some embodiments, the diffusion barrier layer 114 produces a characteristic resistance that is much lower than that achieved using the metal layer 430 (and the silicon-containing conductive material 440). In some embodiments, the diffusion barrier layer 114 is utilized to prevent out-diffusion of dopant impurities from the conductive plug 112 to the semiconductor substrate 100.

Figure 11:
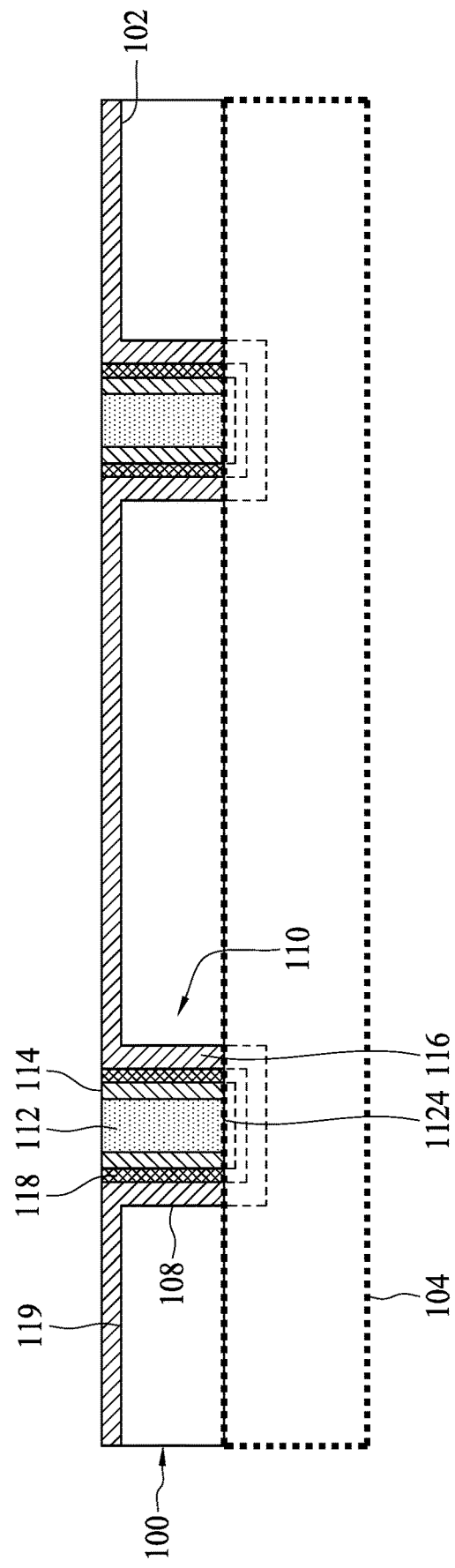
Figure 12:
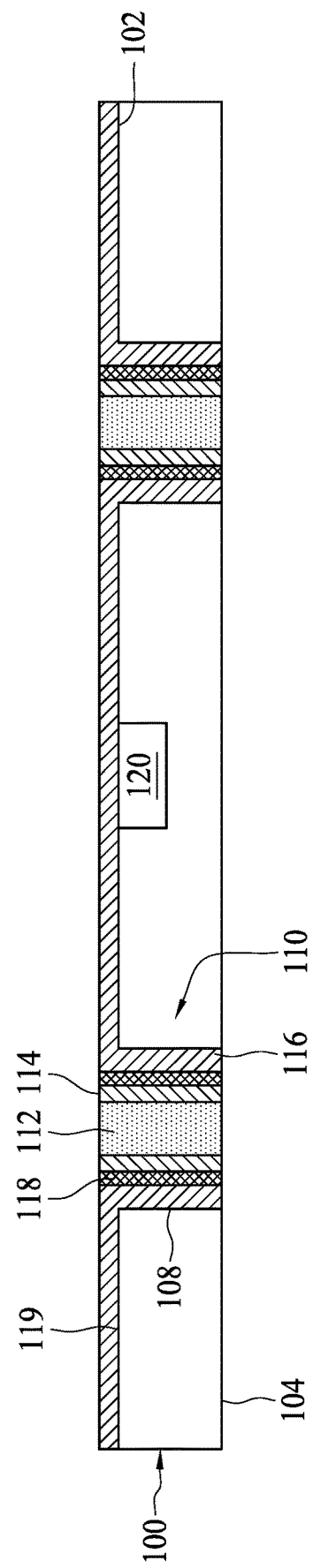

Referring to FIG. 11, a grinding process is performed to expose the conductive plug 112 according to a step 316 in FIG. 3. Accordingly, a through silicon via 110 is formed. In some embodiments, the semiconductor substrate 100 is ground from the back surface 104 until an end surface 1124 of the conductive plug 112 is exposed. In some embodiments, a portion of the insulation layer 425 connected to the first wall 106 is ground, and the remaining insulation layer including a first insulation layer 116 and second insulation layer 119, wherein the first insulation layer 116 is connected to the second wall 108, and the second insulation layer 119 is disposed on the front surface 102. In some embodiments, portions of the unreacted metal layer 118 and the diffusion barrier layer 114 disposed over the first wall 106 are removed after the performing of the grinding process. As shown in FIG. 11, in some embodiments, the through silicon via 110 disposed in the semiconductor substrate 100 includes the conductive plug 112 penetrating through the semiconductor substrate 100, the diffusion barrier layer 114 encircling the conductive plug 112, and the first insulation layer 116 surrounding the diffusion barrier layer 114. In some embodiments, the through silicon via 110 may further include the is unreacted metal layer 118 disposed between the diffusion barrier layer 114 and the first insulation layer 116.

After the through silicon via 110 is completely formed, conventional process steps are used to form at least one semiconductor component 120 on the semiconductor substrate 100 according to a step 318 in FIG. 3. Accordingly, the semiconductor device 10 is completely formed.

In conclusion, with the configuration of the semiconductor device 10, the diffusion barrier layer 114 provided between the conductive plug 112 and the first insulation layer 116 and containing silicide is not only used for preventing dopants introduced into the conductive plug 112 from diffusing into the semiconductor component 120, but also serves to reduce the total resistance of the through silicon via 110.

One aspect of the present disclosure provides a semiconductor device. The semiconductor device includes a semiconductor substrate and at least one through silicon via. The through silicon via includes a conductive plug, a first insulation layer, and a diffusion barrier layer. The conductive plug penetrates through the semiconductor substrate, the first insulation layer surrounds the conductive plug, and the diffusion barrier layer is disposed between the conductive plug and the first insulation layer.

One aspect of the present disclosure provides a method of manufacturing a semiconductor device. The method includes steps of providing a semiconductor substrate; forming at least one blind hole in the semiconductor substrate; depositing a metal layer on a front surface of the semiconductor substrate and extending into the blind hole; depositing a conductive material in the blind hole; performing a thermal process to make portions of the metal layer react with the conductive material to form a diffusion barrier layer; and performing a grinding process from a back surface, opposite to the front surface, of the semiconductor substrate until the conductive material is exposed.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, to manufacture, compositions of matter, means, methods, or steps.

What is claimed is:

1. A semiconductor device, comprising:
   a semiconductor substrate; and
   at least one through silicon via comprising:
      a conductive plug penetrating through the semiconductor substrate;
      a first insulation layer surrounding the conductive plug;
      a diffusion barrier layer disposed between the conductive plug and the first insulation layer; and
      a metal layer disposed between the first insulation layer and the diffusion barrier layer, wherein the metal layer is directly contacted with the first insulation layer and the diffusion barrier layer.

2. The semiconductor device of claim 1, wherein the metal layer includes a metal material, and the diffusion barrier layer includes the metal material.

3. The semiconductor device of claim 1, wherein the diffusion barrier layer is a metal silicide layer.

4. The semiconductor device of claim 1, further comprising a second insulation layer disposed on a front surface of the substrate.

5. The semiconductor device of claim 4, wherein a top surface of the conductive plug is coplanar with an upper surface of the second insulation layer disposed on the front surface.

6. The semiconductor device of claim 4, wherein the first insulation layer is connected to the second insulation layer.

7. The semiconductor device of claim 4, wherein the first insulation layer and the second insulation layer are integrally formed.

8. The semiconductor device of claim 1, wherein the first insulation layer is in contact with the semiconductor substrate.

9. The semiconductor device of claim 1, further comprising at least one semiconductor component disposed on the semiconductor substrate.

\* \* \* \* \*